United States Patent [19]

Beranger et al.

[11] 4,430,737
[45] Feb. 7, 1984

[54] EXCLUSIVE OR CIRCUIT AND PARITY CHECKING CIRCUIT INCORPORATING THE SAME

[75] Inventors: Herve Beranger, Fontainebleau; Armand Brunin, LeMee, both of France

[73] Assignee: International Business Machines Corporation, Armonk, N.Y.

[21] Appl. No.: 342,875

[22] Filed: Jan. 26, 1982

[30] Foreign Application Priority Data

Jun. 25, 1981 [EP] European Pat. Off. ............ 81430020

[51] Int. Cl.$^3$ .................. G06F 11/10; H03K 19/21
[52] U.S. Cl. ......................................... 371/49; 307/471
[58] Field of Search ........................ 371/49; 307/471

[56] References Cited

U.S. PATENT DOCUMENTS

| 3,129,406 | 4/1964 | Perley | 371/49 |
| 3,309,666 | 3/1967 | Frohman | 371/49 |
| 3,649,844 | 3/1972 | Kroos | 371/49 |
| 4,328,435 | 5/1982 | Case | 307/466 |

FOREIGN PATENT DOCUMENTS 7443620 12/1974 France .

OTHER PUBLICATIONS

IBM Technical Disclosure Bulletin, "MTL Exclusive OR Circuit", G. J. Robbins, vol. 19, No. 6, Nov. 1976, p. 2077.
G. E. Hack, Even-Odd Circuit, IBM Technical Disclosure Bulletin, vol. 7., No. 6, Nov. 1964, pp. 425-426.
IBM Technical Disclosure Bulletin, "Gated Two-Way Exclusive 'OR' Trigger" by O. J. Bedrij, vol. 2, No. 6, Apr. 1970, p. 51.
IBM Technical Disclosure Bulletin, "Gated Exclusive OR Circuit", F. H. Lohrey et al., vol. 19, No. 6, Nov. 1976, p. 2080.
IBM Technical Disclosure Bulletin, "Exclusive 'OR' Circuit" by R. C. Greenhalgh, vol. 2, No. 6, Apr. 1960, pp. 98-99.
IBM Technical Disclosure Bulletin, "Cascode Exclusive OR", J. E. Gersbach, vol. 19, No. 6, Nov. 1976, pp. 2010-2011.
IBM Technical Disclosure Bulletin, "Three-Level Exclusive OR" by W. H. McAnney, vol. 4, No. 7, Dec. 1961, pp. 58-59.
IBM Technical Disclosure Bulletin, "Exclusive OR Shift Circuit" by J. W. Delmege, Jr., vol. 5, No. 1, Jun. 1962, p. 63.
IBM Technical Disclosure Bulletin, "Exclusive OR Input Decoders for PLA", P. S. Balasubramanian et al., vol. 20, No. 6, Nov. 1977, pp. 2308-2309.
IBM Technical Disclosure Bulletin, "Three Transistor Exclusive OR Circuit", L. J. Patterson, vol. 5, No. 8, Jan. 1963, pp. 38-39.
IBM Technical Disclosure Bulletin, "'4-Way Exclusive OR", A. Weinberger, vol. 20, No. 8, Jan. 1978, pp. 3220-3222.
IBM Technical Disclosure Bulletin, "One Transistor, Exclusive OR Circuit" by I. G. Akmenkalns, vol. 5, No. 12, May 1963, pp. 65-66.
IBM Technical Disclosure Bulletin, "Two-Level Not Exclusive OR", L. J. Boland, vol. 7, No. 9, Feb. 1965, pp. 743-744.
IBM Technical Disclosure Bulletin, "Error Detecting Circuit For Open Input Terminals", G. A. Maley et al., vol. 21, No. 7, Dec. 1978, pp. 2806-2808.
IBM Technical Disclosure Bulletin, "Logic Level Equal-Compare Circuit", L. J. Wallace, vol. 8, No. 2, Jul. 1965, p. 330.
IBM Technical Disclosure Bulletin, "Summing of Exclusive-OR Terms Having a Common Factor by Converting to a Single XOR", A. Weinberger, vol. 22, No. 1, Jun. 1979, pp. 234-236.
IBM Technical Disclosure Bulletin, "Exclusive-OR Circuit", A. Kuck et al., vol. 8, No. 4, Sept. 1965, p. 672.
IBM Technical Disclosure Bulletin, "Inverse Exclusive-OR Circuit", T. S. Jen, vol. 8, No. 8, Jan. 1966, pp. 1156-1157.
IBM Technical Disclosure Bulletin, "High Speed Exclusive-OR Circuit", R. L. Ehrlickman, vol. 22, No. 6, Nov. 1979, p. 2291.
IBM Technical Disclosure Bulletin, "Exclusive-OR Circuit", D. W. Murphy, vol. 8, No. 11, Apr. 1966, p. 1660.
IBM Technical Disclosure Bulletin, "Exclusive OR Circuit", Z. T. Dearden et al., vol. 23, No. 2, Jul. 1980, pp. 684–685.

IBM Technical Disclosure Bulletin, "Exclusive–OR Complement Circuit", P. J. Evans, vol. 9, No. 9, Feb. 1967, pp. 1210–1211.

IBM Technical Disclosure Bulletin, "Parallel-Reset Shift Register With Exclusive–OR Latches", J. J. Kennedy, et al., vol. 1, No. 9, Feb. 1969, p. 1133–1134.

IBM Technical Disclosure Bulletin, "Exclusive OR Output Latch for PLA", P. S. Balasubramanian et al., vol. 20, No. 6, Nov. 1977, pp. 2310–2311.

IBM Technical Disclosure Bulletin, "Four-Way Exclusive–OR", J. E. Gersbach, vol. 11, No. 9, Feb. 1969, pp. 1162–1163.

IBM Technical Disclosure Bulletin, "T$^2$L Exclusive OR", F. Montegari, vol. 19, No. 9, Feb. 1977, p. 3430.

IBM Technical Disclosure Bulletin, "Exclusive–OR Logic", R. T. sha, vol. 12, No. 8, Jan. 1970, pp. 1287–1288.

IBM Technical Disclosure Bulletin, "Exclusive–OR Circuit", J. Villejoubert, vol. 12, No. 9, Feb. 1970, p. 1469.

IBM Technical Disclosure Bulletin, "Exclusive OR Circuit Conditioned by a Plurality of Gates", J. Brandon, vol. 19, No. 10, Mar. 1977, pp. 3761–3762.

IBM Technical Disclosure Bulletin, "Integrated Circuit Exclusive–OR Circuit", W. Rosenbluth, vol. 12, No. 11, Apr. 1970, p. 1766.

IBM Technical Disclosure Bulletin, "Three-Device Exclusive OR Circuit", P. S. Balasubramanian et al., vol. 20, No. 10, Mar. 1978, pp. 4014–4015.

IBM Technical Disclosure Bulletin, "Exclusive–OR Circuit", J. A. Palmieri et al., vol. 13, No. 5, Oct. 1970, p. 1074.

IBM Technical Disclosure Bulletin, "Bootstrap FET 'OR' Circuit", W. M. Smith, Jr., vol. 13, No. 7, Dec. 1970, p. 1815.

IBM Technical Disclosure Bulletin, "Unverted XOR Circuit", A. Brunin, vol. 21, No. 5, Oct. 1978, p. 1913.

IBM Technical Disclosure Bulletin, "Exclusive OR Data Manipulation For Cyclic Code Generation", J. D. Dixon, vol. 14, No. 3, Aug. 1971, p. 857.

IBM Technical Disclosure Bulletin, "Exclusive OR Circuit", A. Y. Chang et al., vol. 22, No. 2, Jul. 1979, pp. 593–594.

IBM Technical Disclosure Bulletin, "Exclusive OR Set Latch", C. W. Hannaford, vol. 14, No. 9, Feb. 1972, pp. 2827–2828.

IBM Technical Disclosure Bulletin, "Dynamic FET Half-Cycle Delay Exclusive OR Circuit", S. C. Pi, vol. 14, No. 12, May 1972, p. 3648.

IBM Technical Disclosure Bulletin, "Bipolar Selector Functions", R. T. Dennison et al., vol. 23, No. 5, Oct. 1980, pp. 1913–1914.

IBM Technical Disclosure Bulletin, "Two-Way Exclusive 'OR' Using Complementary FETs", S. P. Bennett, vol. 16, No. 3, Aug. 1973, p. 1007.

IBM Technical Disclosure Bulletin, "Exclusive OR Circuit(XOR)", G. J. Gaudenzi, vol. 16, No. 10, Mar. 1974, p. 3249.

IBM Technical Disclosure Bulletin, "NPN-PNP Exclusive OR", F. A. Montegari, vol. 23, No. 10, Mar. 1981, p. 4502.

IBM Technical Disclosure Bulletin, "Inverse Exclusive OR Circuit For Dynamic Logic", L. R. Lau et al., vol. 17, No. 6, Nov. 1974, pp. 1666–1667.

IBM Technical Disclosure Bulletin, "Odd/Even Shunt Circuits", M. P. Marcus, vol. 17, No. 8, Jan. 1975, pp. 2234–2236.

IBM Technical Disclosure Bulletin, "Exclusive OR Invert Circuit", P. Debord et al., vol. 18, No. 1, Jun. 1975, p. 137.

IBM Technical Disclosure Bulletin, "Parity Check Circuit Arrangement For Random-Access Memory Array", C. Marzin et al., vol. 18, No. 5, Oct. 1975, pp. 1411–1412.

IBM Technical Disclosure Bulletin, "Four-Bit Exclusive OR Circuit", J. C. Leininger, vol. 18, No. 6, Nov. 1975, pp. 1681–1682.

IBM Technical Disclosure Bulletin, "Antisaturation Clamp For XOR Circuit", D. Swietek, vol. 18, No. 8, Jan. 1976, p. 2508.

IBM Technical Disclosure Bulletin, "Logical Circuit", Y. M. Ting, vol. 18, No. 9, Feb. 1976, p. 2882.

IBM Technical Disclosure Bulletin, "Single-Cell Exclusive OR Circuit", E. B. Eichelberger et al., vol. 18, No. 9, Feb. 1976, pp. 2892–2893.

IBM Technical Disclosure Bulletin, "Exclusive OR Circuit", A. A. Hansen, vol. 19, No. 4, Sept. 1976, pp. 1235–1236.

IBM Technical Disclosure Bulletin, "Bubble Domain

Exclusive OR Gate", H. J. Yu, vol. 19, No. 5, Oct. 1976, pp. 1932–1933.

*Primary Examiner*—Charles E. Atkinson
*Attorney, Agent, or Firm*—Wesley DeBruin

[57] ABSTRACT

An Exclusive OR circuit with at least two inputs (1 and 2) which exhibits a good immunity to noise. The circuit comprises diodes (D1 and D2) and two transistors (T1 and T2) which have their emitters connected to a reference voltage VR and produce AB at C1. Transistors (T14 and T5) produce $\overline{AB}$ at C2, and output transistors (T13 and T6) produce $$\overline{A}\,\overline{B} + A\,B = A \oplus B$$

at 3. This circuit can advantageously be used to realize a parity checking circuit.

28 Claims, 5 Drawing Figures

EXCLUSIVE OR CIRCUIT AND PARITY CHECKING CIRCUIT INCORPORATING THE SAME

This invention relates to Exclusive OR circuits and to the use thereof in a parity checking circuit.

Parity checking is a conventional means used to verify the proper operation of digital data processing systems. In most data processing systems, the bits are arranged in 8-bit bytes and a parity bit is appended to the eight bits of each byte to make the group of 9 bits always include an even number or an odd number of 1's, depending upon the convention being used. The parity of the 9 bits is checked after every data transfer operation, storage read operation, etc.

In large systems, therefore, the number of such checks may be considerable, and it is necessary that these be carried out as quickly as possible in order not to impede the processing of data. Also, these circuits should not take too much space in relation to the data processing system as a whole.

BACKGROUND ART

Parity checking circuits generally comprise Exclusive OR or Exclusive OR circuits, as described in an article entitled "Parity Check Circuit Arrangement for Random Access Memory Array" by C. Marzin et al., published in the IBM Technical Disclosure Bulletin, Vol. 18, No. 5, October 1975, pages 1411-1421.

The parity checking circuit described in said article comprises four stages of two-input Exclusive OR circuits. Since each stage introduces some delay, the checking operation performed by this circuit is a comparatively lengthy process.

One may also use a network of three-input Exclusive OR circuits of the type described in French patent application No. 74 43620 filed in France by the present applicant on Dec. 31, 1974, publication No. 2 296 969. However, three-input Exclusive OR circuits require many components since the Exclusive OR function ($\oplus$) of three inputs, A,B,C, which is written:

$$A \oplus B \oplus C = \overline{AB}C + \overline{A}B\overline{C} + A\overline{B}\overline{C} + ABC$$

necessitates four AND circuits and four OR circuits as well as complement-value generating circuits, all of which take much space. Consequently, the elimination of a logic stage entails an increase of the space occupied by the circuit.

Numerous Exclusive OR circuits having two, three and four inputs are known to the art. In this regard reference is made to the following U.S. patent application, U.S. patent and IBM Technical Disclosure Bulletin publications:

U.S. patent application Ser. No. 108,323, entitled "Dynamically Switchables Logic Block For JK/EOR Functions" by Jerry R. Case, filed Dec. 31, 1979, granted as U.S. Pat. No. 4,328,435 on May 4,1982.

U.S. Pat. No. 3,129,406 entitled "Digital Signal Comparison Circuit" granted Apr. 14, 1964 to R. Perley;

IBM Technical Disclosure Bulletin publications:

"Gated Two-Way Exclusive 'OR' Trigger" by O. J. Bedrij, Vol. 2, No. 6, April 1970, page 51;

"Exclusive 'OR' Circuit" by R. C. Greenhalgh, Vol. 2, No. 6, April 1960, pages 98-99;

"Three-Level Exclusive OR" by W. H. McAnney, Vol. 4, No. 7, December 1961, pages 58-59;

"Exclusive OR Shift Circuit" by J. W. Delmege, Jr., Vol. 5, No. 1, June 1962, page 63;

"Three Transistor Exclusive OR Circuit" by L. J. Patterson, Vol. 5, No. 8, January 1963, pages 38-39;

"One Transistor, Exclusive OR Circuit" by I. G. Akmenkalns, Vol. 5, No. 12, May 1963, pages 65-66;

"Two-Level Not Exclusive OR" by L. J. Boland, Vol. 7, No. 9, February 1965, pages 743-744;

"Logic Level Equal-Compare Circuit" by L. J. Wallace, Vol. 8, No. 2, July 1965, page 330;

"Exclusive-OR Circuit" by A. Kuck et al., Vol. 8, No. 4, September 1965, page 672;

"Inverse Exclusive-OR Circuit" by T. S. Jen, Vol. 8, No. 8, January 1966, pages 1156-1157;

"Exclusive-OR Circuit" by D. W. Murphy Vol. 8, No. 11, April 1966, page 1660;

"Exclusive-OR Complement Circuit" by P. J. Evans, Vol. 9, No. 9, February 1967, pages 1210-1211;

"Parallel-Reset Shift Register With Exclusive-OR Latches" by J. J. Kennedy, et al., Vol. 11, No. 9, February 1969, pages 1133-1134;

"Four-Way Exclusive-OR" by J. E. Gersbach, Vol. 11, No. 9, February 1969, pages 1162-1163;

"Exclusive-OR Logic" by R. T. Sha, Vol. 12, No. 8, January 1970, pages 1287-1288;

"Exclusive-OR Circuit" by J. Villejoubert, Vol. 12, No. 9, February 1970, page 1469;

"Integrated Circuit Exclusive-Or Circuit" by W. Rosenbluth, Vol. 12, No. 11, April 1970, page 1766;

"Exclusive-OR Circuit" by J. A. Palmieri et al., Vol. 13, No. 5, October 1970, page 1074;

"Bootstrap FET 'OR' Circuit" by W. M. Smith, Jr., Vol. 13, No. 7, December 1970, page 1815;

"Exclusive OR Data Manipulation For Cyclic Code Generation" by J. D. Dixon, Vol. 14, No. 3, August 1971, page 857;

"Exclusive OR Set Latch" by C. W. Hannaford, Vol. 14, No. 9, February 1972, pages 2827-2828;

"Dynamic FET Half-Cycle Delay Exclusive OR Circuit" by S. C. Pi, Vol. 14, No. 12, May 1972, page 3648;

"Two-Way Exclusive 'OR' Using Complementary FETs" by S. P. Bennett, Vol. 16, No. 3, August 1973, page 1007;

"Exclusive OR Circuit (XOR)" by G. J. Gaudenzi, Vol. 16, No. 10, March 1974, page 3249;

"Inverse Exclusive OR Circuit For Dynamic Logic" by L. R. Lau et al., Vol. 17, No. 6, November 1974, pages 1666-1667;

"Odd/Even Shunt Circuits" by M. P. Marcus, Vol. 17, No. 8, January 1975, pages 2234-2236;

"Exclusive OR Invert Circuit" by P. Debord et al., Vol. 18, No. 1, June 1975, Page 137;

"Parity Check Circuit Arrangement For Random-Access Memory Array" by C. Marzin et al., Vol. 18, No. 5, October 1975, pages 1411-1412;

"Four-Bit Exclusive OR Circuit" by J. C. Leininger, Vol. 18, No. 6, November 1975, pages 1681-1682;

"Antisaturation Clamp For XOR Circuit" by D. Swietek, Vol. 18, No. 8, January 1976, page 2508;

"Logical Circuit" by Y. M. Ting, Vol. 18, No. 9, February 1976, page 2882;

"Single-Cell Exclusive OR Circuit" by E. B. Eichelberger et al., Vol. 18, No. 9, February 1976, pages 2892-2893; "Exclusive OR Circuit" by A. A. Hansen, Vol. 19, No. 4, September 1976, pages 1235-1236;

"Bubble Domain Exclusive OR Gate" by H. J. Yu, Vol. 19, No. 5, October 1976, pages 1932-1933;

"MTL Exclusive OR Circuit" by G. J. Robbins, Vol. 19, No. 6, November 1976, page 2077;

"Gated Exclusive OR Circuit" by F. H. Lohrey et al., Vol. 19, No. 6, November 1976, page 2080;

"Cascode Exclusive OR" by J. E. Gersbach, Vol. 19, No. 6, November 1976, pages 2010-2011;

"T$^2$L Exclusive OR" by F. Montegari, Vol. 19, No. 9, February 1977, page 3430;

"Exclusive OR Circuit Conditioned by A Plurality of Gates" by J. Brandon, Vol. 19, No. 10, March 1977, pages 3761-3762;

"Exclusive OR Input Decoders For PLA" by P. S. Balasubramanian et al., Vol. 20, No. 6, November 1977, pages 2308-09;

"Exclusive OR Output Latch For PLA" by P. S. Balasubramanian et al., Vol. 20, No. 6, November 1977, pages 2310-2311;

"4-Way Exclusive OR" by A. Weinberger, Vol. 20, No. 8, January 1978, pages 3220-3222;

"Three-Device Exclusive OR Circuit" by P. S. Balasubramanian et al., Vol. 20, No. 10, March 1978, pages 4014-4015;

"Inverted XOR Circuit" by A. Brunin, Vol. 21, No. 5, October 1978, page 1913;

"Error Detecting Circuit For Open Input Terminals" by G. A. Maley et al., Vol. 21, No. 7, December 1978, pages 2806-2808;

"Summing of Exclusive-OR Terms Having a Common Factor by Converting To a Single XOR" by A. Weinberger, Vol. 22, No. 1, June 1979, pages 234-236;

"Exclusive OR Circuit" by A. Y. Chang et al., Vol. 22, No. 2, July 1979, pages 593-594;

"High Speed exclusive-OR Circuit" by R. L. Ehrlickman, Vol. 22, No. 6, November 1979, page 2291;

"Exclusive OR Circuit" by Z. T. Dearden et al., Vol. 23, No. 2, July 1980, pages 684-685;

"Bipolar Selector Functions" by R. T. Dennison et al., Vol. 23, No. 5, October 1980, pages 1913-1914;

"NPN-PNP Exclusive OR" by F. A. Montegari, Vol. 23, No. 10, March 1981, page 4502.

SUMMARY OF THE INVENTION

It is, therefore, an object of this invention to provide an Exclusive OR circuit having at least two inputs and exhibiting improved operational characteristics.

It is another object of this invention to provide a parity checking circuit which only requires three stages of logic circuits, using Exclusive OR circuits which are in accordance with the preceding object.

The two-input Exclusive OR circuit of the present invention comprises two input terminals to which binary signals A and B are applied and an output terminal at which a signal representing the result of the Exclusive OR function, A⊕B, is obtained. The circuit includes a reference voltage generator; a first circuit which performs the logic function $\overline{A}\,\overline{B}$ and comprises a first and a second transistors whose emitters are connected to the output of the reference voltage generator and whose collectors are connected together, and a first and a second diodes, the first of which has an electrode connected to the base of the first transistor and the other electrode connected to one of the input terminals, and the second of which has an electrode connected to the base of the second transistor and the other electrode connected to the other input terminal; a second circuit performing the logic function AB and including third and fourth transistors whose collectors are connected together and whose emitters are connected to the input terminals; a third circuit having two inputs each of which is connected to the common collectors of the first and second circuits, and an output at which the function $$A \oplus B = \overline{AB + \overline{AB}}$$

is obtained.

The parity checking circuit that is used to generate an indication of the parity of a 9-bit input word comprises a first stage consisting of four two-input Exclusive OR circuits of the type described earlier, with each input receiving one of the bits of the word, and a true/complement value generator that receives the remaining bit of the input word and provides the true value thereof at a first output and the complement value thereof at a second output; a second stage comprising two comparison means which invert the results of the comparisons made, with the first of said means comparing the outputs of the first and second Exclusive OR circuits and the second of said means comparing the outputs of the third and fourth Exclusive OR circuits; and a third stage which generates said indication of parity as derived from the outputs of the comparison means and from the true/complement values provided by the true/complement value generator.

DISCLOSURE OF THE INVENTION

Figure 1:
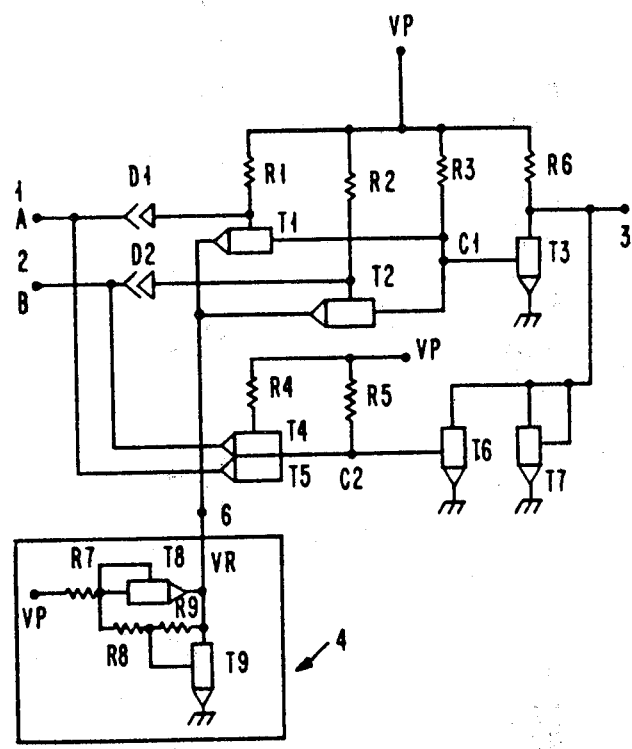
FIG. 1 shows a two-input Exclusive OR circuit in accordance with the present invention.

The Exclusive OR circuit of FIG. 1 comprises a first couple of transistors T1 and T2 and two Schottky diodes D1 and D2 which use the signals A and B applied to inputs 1 and 2 to provide at node C1 the binary signal resulting from the logic function $\overline{A}\,\overline{B}$, and another couple of transistors T4 and T5 which provide at node C2 the binary signal resulting from the logic function A B. The signal obtained at the nodes C1 and C2 are fed to a circuit that comprises two transistors T3 and T6 and provides at output 3 the binary signal resulting from the logic function $$\overline{A}\ B + A\overline{B}$$

which is equal to $A\ \overline{B} + \overline{A}\ B$, that is, to the Exclusive OR function $A \oplus B$.

The input signals A and B are respectively applied to the cathodes of diodes D1 and D2. The anodes of these diodes are connected to the bases of transistors T1 and T2. The bases of transistors T1 and T2 are also connected to a biasing voltage VP through resistors R1 and R2, respectively. The emitters of transistors T1 and T2 are connected to a reference voltage generator 4 which supplies a voltage VR of lower value than VP. Both collectors are connected to the node C1 which is in turn connected to the biasing voltage VP through a resistor R3.

The input signals are also applied to the emitters of transistors T4 and T5 both of whose bases are connected to the voltage VP through a resistor R4. Both collectors are connected to the node C2 which is itself connected to VP through a resistor R5.

The nodes C1 and C2 are connected to the bases of transistors T3 and T6, respectively. The emitters of these transistors are connected to ground and both collectors are connected to output 3. A resistor R6 connects the collectors of transistors T3 and T6 to the voltage VP. A grounded emitter transistor T7, which is connected as a diode and whose base and collector are both connected to output 3, serves to reduce the output signal fall time.

A suitable reference voltage generator is shown by way of example in FIG. 1. This generator comprises two transistors T8 and T9 and three resistors R7, R8, R9. T8 is connected as a diode while T9 is connected as a grounded emitter amplifier with collector-to-base feedback. The collector and the base of transistor T8 are connected to the voltage VP via resistor R7 and its emitter is connected to output 6 of the generator, where voltage VR is generated. Resistors R8 and R9 are connected in series between the collectors of transistors T8 and T9. The node common to these resistors is connected to the base of transistor T9, whose collector is connected to terminal 6. The voltage VR at terminal 6 may be expressed as follows:

$$VR = VBE(T9) - R9\ VBE\ (T8)/(R8 + R9)$$

where VBE (T9) and VBE (T8) are the emitter-to-base voltages of transistors T9 and T8, respectively.

In a preferred embodiment, the resistors and the voltages have the following values:

R1=R2=13 kΩ
R3=7.5 kΩ
R4=15 kΩ
R5=R9=11 kΩ
R6=8 kΩ
R7=5 kΩ
R8=6 kΩ, and
VP=1.7 volts
VR=0.35 volt In the circuit shown in FIG. 1, it may be seen that a low binary signal is generated at node C1 when either or both inputs are 1 and that a high signal is provided when both inputs are 0. Consequently, the logic level at C1 represents the result of the function $\overline{A}\ \overline{B}$.

A high binary signal is generated at node C2 when both A and B are 1, while a low signal is obtained at this node if both A and B are 0, or if A=0, B=1, or if A=1, B=0. Therefore, the logic level at C2 is representative of the result of the function A B.

If A=1 and B=1:
Diodes D1 and D2 are turned off, transistors T1 and T2 are conducting and a low logic level is obtained at C1. Transistors T4 and T5 are turned off, and a high logic level is obtained at C2.

Since a low signal is provided at C1 and a high signal at C2, transistor T3 is turned off and transistor T6 is conducting. Accordingly, a low signal representing a 0, i.e. $A \oplus B$, is obtained at output 3.

If A=0 and B=0:
Diodes D1 and D2 are conducting, transistors T1 and T2 are turned off, and a high signal is provided at C1. Transistors T4 and T5 are conducting and a low signal is obtained at C2.

Under these conditions, transistor T3 is conducting and transistor T6 is turned off, so that a low signal representing a 0, i.e. $A \oplus B$, is obtained at output 3.

If A=1 and B=0:
Diode D1 is turned off and transistor T1 is conducting. Diode D2 is conducting, transistor T2 is turned off and a low signal is provided at C1. Transistor T4 is turned off, transistor T5 is conducting and a low signal is obtained at C2.

Under these conditions, transistors T3 and T6 are turned off, so that a high signal representing a 1, i.e., $A \oplus B$, is obtained at output 3.

If A=0 and B=1:
Diode D1 is conducting and transistor T1 is turned off. Diode D2 is turned off and transistor T2 is conducting. A low signal is obtained at C1. Transistor T4 is conducting, transistor T5 is turned off, and a low signal is obtained at C2.

Under these conditions, transistors T3 and T6 are turned off, so that a high signal representing a 1, i.e. $A \oplus B$, is obtained at output 3.

As distinct from the simplest types of conventional circuits wherein a comparison between the two inputs involves the use of transistors or Schottky barrier diodes, the advantage of the circuit shown in FIG. 1 is that the threshold at either input is not dependent upon the DC level at the other input. This is a significant advantage since it is known that in integrated circuits of the TTL family the low DC signal level lies in the range of 0.2 to 0.4 volt, depending upon the circuit load and the method of integration. This adversely affects the delays introduced by the circuit since the signal levels at the two inputs are independent of each other. This disadvantage does not exist in the present circuit wherein the comparison is made in relation to the reference voltage. Thus, since the threshold at one of the inputs is not dependent upon the DC level at the other input, improved immunity to input noise is achieved.

Also, in the present circuit, the complement values of the input signals are not required and the number of elementary logic circuits is significantly reduced as compared with the prior art Exclusive OR circuits comprised of elementary logic circuits requiring four NAND gates.

In addition, the power dissipated by the present circuit is low: this is of the order of 0.8 mW in the Exclusive OR circuit proper and of the order of 0.18 mW in the reference voltage generator. The delay introduced by the circuit is of the order of 1.7 ns. A high density can be achieved, especially if several Exclusive OR circuits can share the same reference voltage.

Also, the principles of the present circuit could be extended to provide a device comprising more than two inputs. An exemplary three-input circuit is illustrated in FIG. 2.

Figure 2:
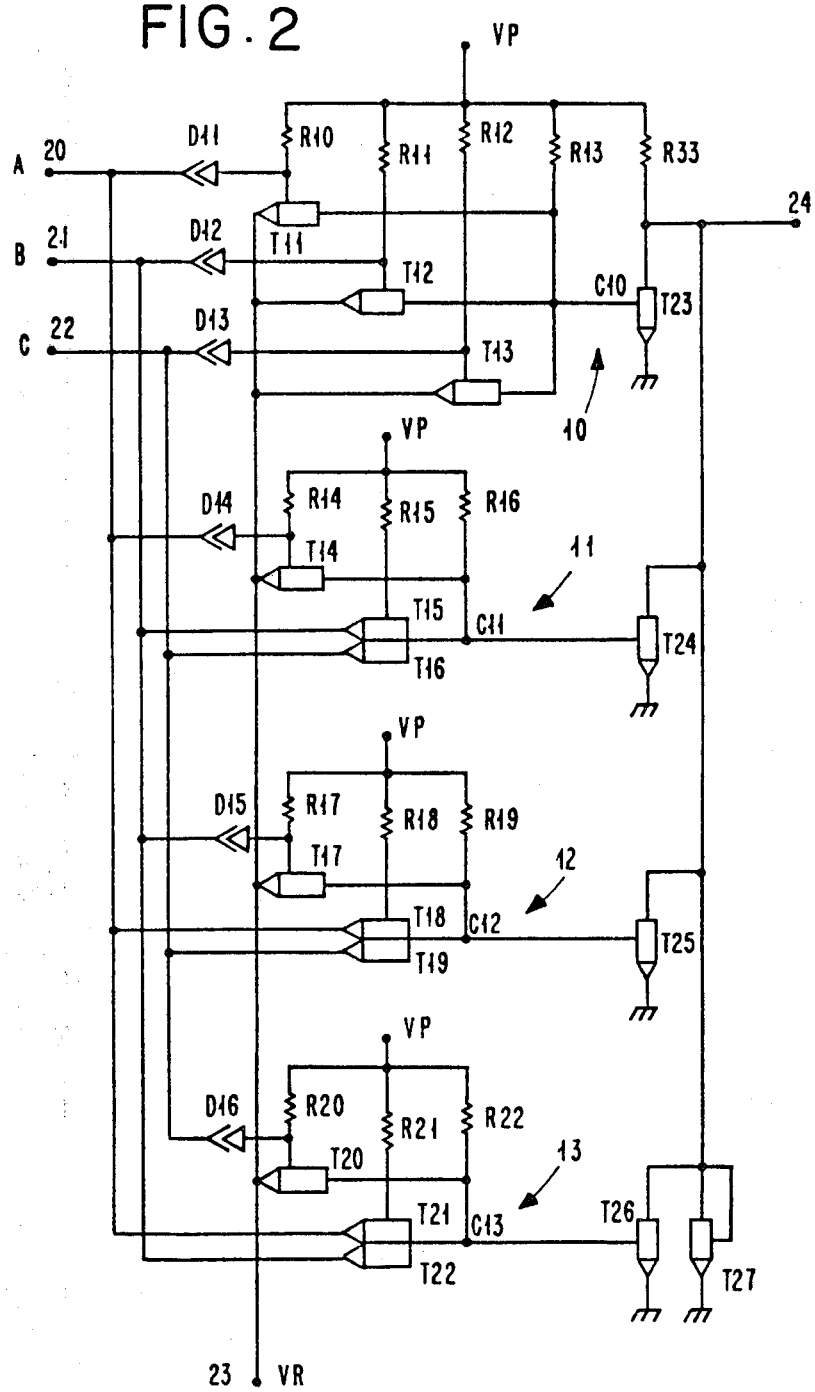
FIG. 2 shows a three-input Exclusive OR circuit in accordance with the principles used in the circuit of FIG. 1.

The circuit of FIG. 2 performs the Exclusive OR function A⊕B⊕C in accordance with the expression:

$$A \oplus B \oplus C = \overline{A}\,\overline{B}\,C + \overline{A}\,B\,\overline{C} + A\,\overline{B}\,\overline{C} + A\,B\,C$$

The circuit comprises circuits 10, 11, 12 and 13 which receive input signals A,B,C and provide the results of the functions $\overline{A}\,\overline{B}\,\overline{C}$, $\overline{A}$ B C, A $\overline{B}$ C and A B $\overline{C}$, respectively. Circuits 11, 12 and 13 are identical. However the connection of the same input signals to each of the circuits differs from circuit to circuit.

Circuit 10 includes three diodes D11, D12 and D13 which have their cathodes connected to the input terminals 20, 21 and 22 of the circuit which receive signals A, B and C, respectively. The anodes are respectively connected to the bases of transistors T11, T12 and T13 whose emitters are connected together to terminal 23, to which the reference voltage VR is applied. The bases of transistors T11, T12 and T13 are connected to biasing voltage VP through resistors R10, R11 and R12, and their collectors are connected to node C10 which is in turn connected to voltage VP through resistor R13.

It will be seen that, in this configuration, a logic level representing the result of the logic function $\overline{A}\,\overline{B}\,\overline{C}$ is generated at node C10. If A, B and C are 0, then the diodes D11-D13 are conducting. Consequently, the transistors are turned off and a high signal is obtained at node C10. If all three inputs are 1, the diodes are turned off and the transistors are conducting, so that a low signal is obtained at C10. If one (or two) input(s) is (are) 0, then the remaining input(s) is (are) 1, at least one of the transistors is conducting and a low signal is obtained at C10.

Circuit 11 includes a diode D14 which has its cathode connected to input terminal 20, which receives signal A, and whose anode is connected to the base of transistor T14. The emitter of transistor T14 is connected to voltage VR and its base is connected to biasing voltage VP through a resistor R14. Two transistors T15 and T16 have their emitters respectively connected to input terminals 21 and 22 (B and C) and their bases connected to voltage VP through a resistor R15; their collectors are connected, together with the collector of transistor T14, to node C11 and, through resistor R16, to voltage VP. This circuit provides the result of the logic function $\overline{A}$ B C at node C11 since the logic level at C11 is high only if A=0, B=1 and C=1, in which case diode D14 is conducting, the three transistors T14-T16 are turned off, and a high logic level is obtained at C11. In all other cases, at least one of the transistors is conducting and a low level is provided at C11.

Circuits 12 and 13 are implemented in a similar manner. These circuits include diodes D15 and D16 corresponding respectively to diode D14; transistors T17-T19 and T20-T22 corresponding to transistors T14-T16, respectively; and resistors R17-R19 and R20-R22 corresponding respectively to resistors R14-R16.

In circuit 12, the cathode of diode D15 is connected to input terminal 21(B) and the emitters of transistors T18 and T19 are connected to input terminals 20 and 22, so that the result of the logic function A $\overline{B}$ C is provided at C12.

In circuit 13, the cathode of D16 is connected to input terminal 22(C) and the emitters of transistors T21 and T22 are connected to input terminals 20 and 22 (A and B), so that the result of the logic function A B $\overline{C}$ is provided at C13.

The nodes C10-C13 are respectively connected to the bases of transistors T23-T26 whose emitters are connected to ground and whose collectors are connected together to output terminal 24 and, through a resistor R33, to voltage VP. Accordingly, these four transistors perform the following function and provide the result thereof at output terminal 24:

$$\overline{A}\,\overline{B}\,\overline{C} + \overline{A}\,B\,C + A\,\overline{B}\,C + A\,B\,\overline{C} = A \oplus B \oplus C$$

The grounded emitter transistor T27, which is connected as a diode and whose base and collector are connected to the common collectors of transistors T23-T26, performs the same function as transistor T7 of FIG. 1. T27 serves to reduce the fall time.

In a preferred embodiment, the resistors have the following values:
R10=R11=R12=15kΩ
R13=11kΩ
R33=8kΩ
R14=R17=R20=20kΩ
R15=R18=R21=23kΩ
R16=R19=R22=17kΩ

The resistors used in circuit 10 have lower values than those in circuits 11-13 in order to achieve equal delays in all four circuits.

The value of the reference voltage must be such that it will allow input transistors T11-T14, T17, T20 and output transistor T23-T26 to turn off, depending on the state of the input signals. In a preferred embodiment, the selected value of the reference voltage is 0.35 volt.

Figure 3:
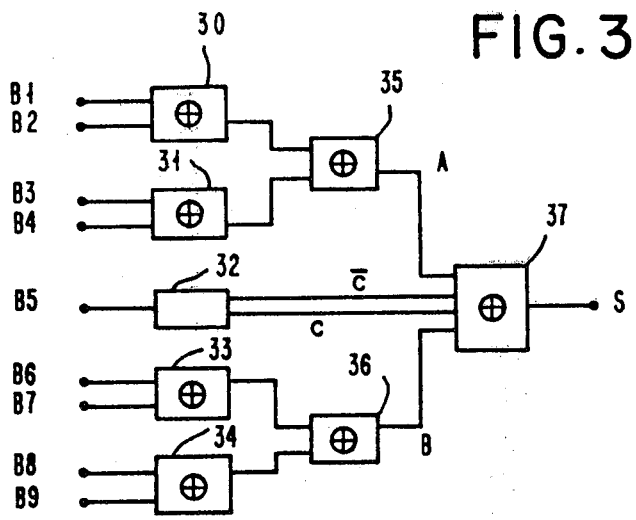
FIG. 3 is a diagram showing a parity checking circuit which incorporates Exclusive OR circuits in accordance with the present invention.

Referring now to FIG. 3, a parity checking circuit in accordance with the principles of the present invention will be described.

This circuit includes a first logic stage that receives the 9 bits of the word whose parity is to be checked. This stage is comprised of four Exclusive OR circuits 30, 31 and 33, 34, which are in accordance with the Exclusive OR circuit of the present invention shown in FIG. 1, and of circuit 32. Circuit 30 receives as inputs bits 1 and 2 (B1 and B2); circuit 31, bits 3 and 4 (B3 and B4); circuit 33, bits 6 and 7 (B6 and B7); and circuit 34, bits 8 and 9 (B8 and B9). Circuit 32 is a true "complement value generator that receives bit 5 (B5) and provides at its outputs the true value of this bit, C, and the complement value thereof, $\overline{C}$.

The second logic stage comprises two Exclusive OR circuits 35 and 36 which receive as inputs the outputs of 30 and 31 and those of 33 and 34, respectively. The outputs of 35 and 36 are labeled A and B, respectively. In a preferred embodiment, these Exclusive OR circuits are mere comparison circuits that provide a 0 signal if the inputs are equal and a 1 signal if they are not, as shown in FIG. 4.

The last stage comprises an Exclusive OR circuit 37 which receives as inputs the outputs of circuits 35 and 36 and the true and complement values C and $\overline{C}$ from 32.

Figure 4:
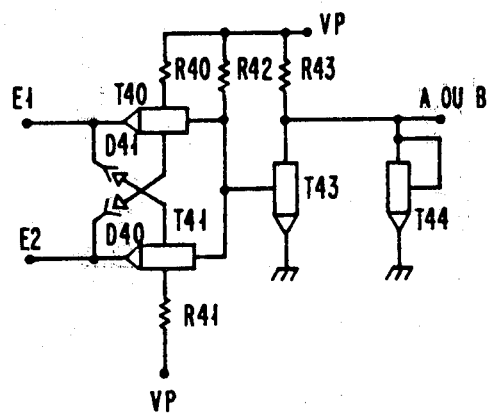
FIG. 4 is a diagram showing a circuit which may be used as circuits 35 and 36 of FIG. 3.

Referring now to FIG. 4, circuits which may be used as circuits 35 and 36 are shown. While circuits such as those shown in FIG. 1 could be used for this purpose, this stage receives no external signals and its input levels are well defined, so that circuits 35 and 36 need not exhibit the same immunity to noise as the circuits of the input stage, which do receive external signals. Consequently, circuits such as circuits 35 and 36 that are extremely simple and fast may be selected.

A typical circuit 35 or 36 is shown in FIG. 4. This circuit comprises two input terminals E1 and E2, to be connected to the outputs of 30 and 31 or of 33 and 34, respectively depending on whether circuit 35 or 36 is involved.

The circuit includes two transistors T40 and T41 which have their emitters connected to input terminals E1 and E2; their bases are connected to the biasing voltage VP through resistors R40 and R41, and their collectors are connected together to voltage VP through a resistor R42. The base of transistor T40 is connected to the emitter of T41 by means of a Schottky diode D40 which has its anode connected to the base and its cathode to the emitter. Similarly, the base of transistor T41 is connected to the emitter of transistor T40 by means of a Schottky diode D41 which has its anode connected to the base and its cathode to the emitter.

An inverter transistor T43 has its base connected to the common collectors. Its emitter is connected to ground, and its collector is connected through a resistor R43 to the biasing voltage VP.

The output A or B of the circuit is taken from the collector of transistor T43.

A transistor T44 connected as a diode serves to limit the high output level. This transistor has its emitter connected to ground while its collector is connected both to its base and to the collector of transistor T43. This transistor should be omitted if the circuit is used as circuit 36 because of the configuration of the circuit that makes up the last stage 37. This should be obvious in view of the configuration of circuit 37 shown in FIG. 5. In circuit 35, however, transistor T44 enables the fall time to be reduced.

The circuit of FIG. 4 operates as follows: whenever the input levels applied to terminals E1 and E2 are identical, transistors T40 and T41 are turned off. As a result, a high level is obtained at the base of transistor T43, this transistor is turned on and the output level is low. If the input levels are not identical, then either of transistors T40 and T41 is conducting, transistor T43 is turned off and the output level is high.

This circuit performs the Exclusive OR function of the two inputs at E1 and E2.

Figure 5:
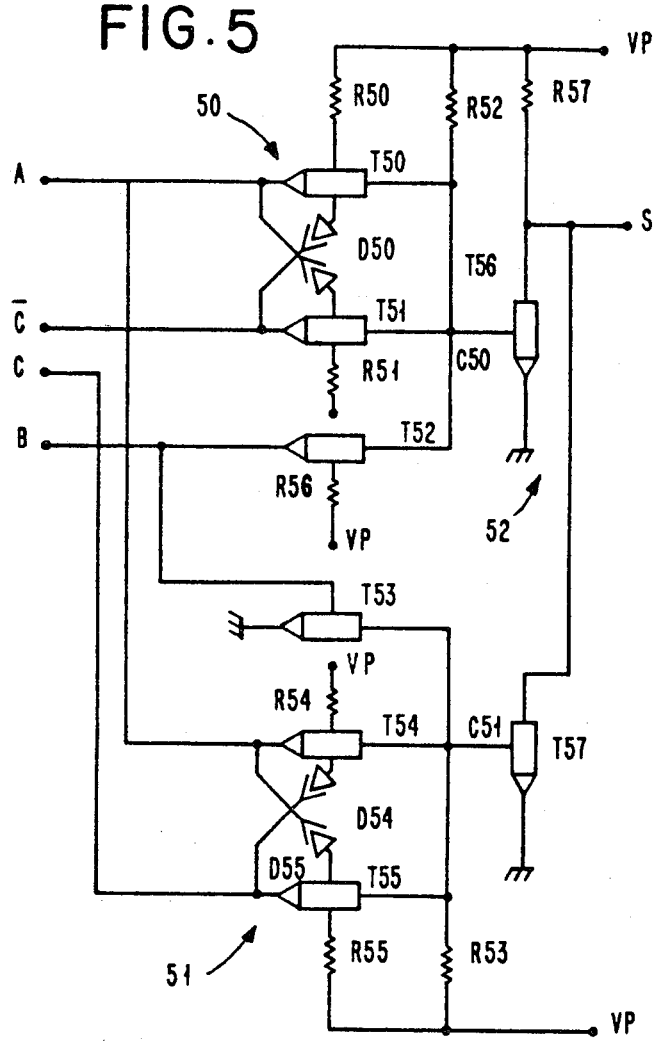
FIG. 5 is a diagram showing a circuit which may be used as circuit 37 of FIG. 3.

Referring now to FIG. 5, a circuit which can be used as circuit 37 will be described. Obviously, the circuit of FIG. 2 could be used, but, as stated earlier, there is no need to use a circuit exhibiting a good immunity to noise since its inputs A, C, $\overline{C}$ and B are not external signals and, therefore, would have well-defined levels.

This circuit includes a first circuit 50 which receives signals A, B and $\overline{C}$ and provides at node C50 a signal representing the result of the function $$\overline{B (A \oplus \overline{C})}$$

and a second circuit 51 which receives signals A, B and C and supplies at node C51 a signal representing the result of the function $$\overline{B (A \oplus C)}$$

An output circuit 52 performs the function $$\overline{B (A \oplus \overline{C})} + \overline{\overline{B} (A \oplus C)} \text{ , or}$$

$$\overline{B (\overline{A}C + A\overline{C}) + \overline{B} (\overline{A}\overline{C} + AC)} =$$

$$\overline{B\overline{A}C + BA\overline{C} + \overline{A}\overline{B}\overline{C} + \overline{B}AC} =$$

$$A \overline{B} \overline{C} + \overline{A} \overline{B} C + A B C + \overline{A} B \overline{C} = A \oplus B \oplus C$$

Circuit 50 comprises three transistors T50-T52 and two Schottky diodes D50 and D51. Transistors T50 and T51, which are associated with diodes D50 and D51 and resistors R50-R52, are connected as in the circuit of FIG. 4, that is, signals A and $\overline{C}$ are respectively applied to the emitters of T50 and T51.

Accordingly, the circuit provides at node C50 the complement of the function A⊕$\overline{C}$ taken from the common collectors of transistors T50 and T51.

Transistor T52 has its emitter receiving signal B and its base connected to biasing voltage VP through resistor R56 while its collector is connected to node C50. This makes it possible to obtain at this node the result of the function $$\overline{B (A \oplus \overline{C})}$$

If B=0, transistor T52 is conducting and a low voltage exists at node C50 regardless of the result of $$A \oplus \overline{C}$$

and if B=1, transistor T52 is turned off and the level obtained at C50 depends upon the result of $$A \oplus \overline{C} \text{ .}$$

Circuit 51 comprises three transistors T53-T55 and two Schottky diodes D54 and D55. Transistors T54 and T55, which are associated with diodes D54 and D55 and with resistors R53-R55, are connected as shown in FIG. 4, that is, signals A is applied to the emitter of T54 and T55 receives signal C.

As a result, the circuit provides at node C51 the result of the function $$\overline{A \oplus C}$$

taken from the common collectors of transistors T54 and T55.

Transistor T53 has its base receiving signal B while its emitter is connected to ground and its collector to node C51.

This allows the result of the function $$\overline{B \ (A \oplus C)}$$

to be obtained at this node.

If B=0, transistor T53 is turned off and the level obtained at C50 will be dependent upon the result of $$\overline{A \oplus C}$$

However, if B=1, transistor T53 is conducting and a low level will be obtained at C51 regardless of the result of $$\overline{A \oplus C}.$$

Circuit 52 comprises transistor T56 and T57 which have their collectors connected together to output S, their emitters connect to ground, and their collectors connected together to biasing voltage VP through resistor R57. This circuit provides at output S the result of the function $$\overline{B \ (A \oplus \overline{C})} + \overline{\overline{B} \ (A \oplus C)}$$

This three-input Exclusive OR circuit is very simple. It comprises few components and, therefore, requires a very small amount of space. The circuit is very fast since its speed will correspond, at worst, to the successive switching times of two transistors. By using sufficient power (1.6 mW), a delay of the order of 2 ns will be obtained. In a preferred embodiment, the resistors have the following values:

R40=R41=R50=R51=R54=R55=R56=11kΩ
R42=R52=R53=4kΩ
R43=R57=8kΩ

Figure 6:
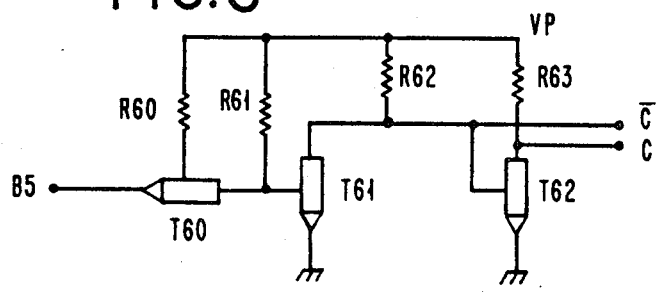
FIG. 6 is a diagram showing a true/complement value generator which may be used as circuit 32 of FIG. 3.

Referring now to FIG. 6, a true/complement value generator which can advantageously be used as circuit 32 of FIG. 3 is shown.

The generator comprises three transistors T60–T62. Signal B5 is applied to the emitter of transistor T60, which has its base connected to the biasing voltage VP through a resistor R60 and its collector connected to the base of transistor T61 and, through a resistor R61, to voltage VP.

Transistor T61 has its emitter connected to ground and its collector is connected, on the one hand, to voltage VP through a resistor R62 and, on the other hand, to output $\overline{C}$ and to the base of transistor T62. The emitter of transistor T62 is connected to ground while its collector is connected to voltage VP through resistor R63 and to output C.

The circuit operates as follows:

If B5 is at a low level (0), transistor T60 is turned on, causing transistor T61 to turn off and transistor T62 to turn on, so that the logic level at $\overline{C}$ is high, thereby representing the complement of B5, while a low (0) logic level is obtained at C.

If B5 is at a high level (1), transistor T60 is turned off, causing transistor T61 to turn on and transistor T62 to turn off, so that the logic level at $\overline{C}$ is low (0) and the logic level at C is high (1).

The circuit shown in FIG. 3 can be used to generate the parity bit. To this end, all that is required is to set bit B5 to 0 or to 1 and to apply the 8 bits of the byte to the other inputs. Whether B5 is to be set to 0 or to 1 solely depends upon the output phase desired. This makes it possible to use a single type of circuit to realize both the parity bit generator and the parity checking circuit.

It will, however, be seen that a parity bit generator could readily be provided by using only the four input Exclusive OR circuits 30, 31, 33, 34 and circuits 35 and 36, and by replacing circuit 37 with a circuit identical to that shown in FIG. 4.

While the invention has been shown and particularly described with reference to a preferred embodiment, it will be understood by those skilled in the art that various changes in form and detail may be made without departing from the spirit and scope of the invention.

We claim:

1. An Exclusive OR circuit comprising two input terminals (1 and 2) to which binary signals A and B are applied and an output terminal (3) at which the result of the function A⊕B is generated, characterized in that it includes:
   a generator (4) providing a reference voltage as its output,
   a first circuit having two input terminals which are the input terminals of the Exclusive OR circuit and an output terminal (C1) at which the result of the function $\overline{AB}$ is generated, including first and second diode (D1, D2) each of which has one of its terminals connected to one of the input terminals, and first and second transistors (T1, T2) having their emitters connected to the output of the reference voltage generator and their collectors connected to the output (C1) of said first circuit, each of the bases being connected to the other terminal of each diode, respectively;
   a second circuit (T4, T5) provided with two inputs connected to the input terminals (1 and 2) of the Exclusive OR circuit, and an output (C2) at which the result of the logic function AB is generated,
   a NOR output circuit (T3, T6) having two inputs connected to the outputs of the first and second circuits and an output constituting the output terminal (3) of the Exclusive OR circuit.

2. An Exclusive OR circuit according to claim 1, characterized in that the second circuit comprises two transistors which have their emitters connected to the input terminals and their collectors connected together to the output terminal (C2) of said AND circuit.

3. An Exclusive OR circuit according to claim 1 or 2, characterized in that the NOR circuit comprises two transistors (T3, T6) which have their bases connected to the output terminals of the first and second circuits (C1, C2) and their collectors connected together to the output terminal (3) of the Exclusive OR circuit.

4. An Exclusive OR circuit comprising at least three input terminals (20, 21, 22) to which binary signals A, B, C are applied and an output terminal (24) at which the result of the Exclusive OR function of the input signals is generated, characterized in that it includes:
   a generator providing a reference voltage at an output terminal (23),
   a first circuit having at least three input terminals which are the inputs of the Exclusive OR circuit and an output terminal (C10) at which the result of the function $\overline{ABC}$ . . . of the input signals is generated, comprising at least three diodes (D11, D12, D13) each of which has one of its terminals connected to one of the input terminals and at least three transistors (T11, T12, T13) having their emitters connected to the output of the reference voltage generator, their collectors connected together to the output (C10) of said first circuit, and each of their bases connected to the other terminal of each diode, respectively, at least three second circuits each of which has at least three inputs connected to the inputs of the Exclusive OR circuit and at least three outputs (C11, C12, C13) at which the results of the functions $\overline{A}BC\ldots, A\overline{B}C\ldots, AB\overline{C}\ldots,$ are generated, a NOR output circuit (T23, T24, T25, T26) having at least four inputs connected to the outputs of the first circuit and of said at least three second circuits, and an output constituting the output terminal (24) of the Exclusive OR circuit.

5. An Exclusive OR circuit according to claim 4, characterized in that each of said second circuits comprises a diode (D14 or D15 or D16) one of whose terminals is connected to one of the input terminals, a first transistor (T14 or T17 or T20) which has its base connected to the other terminal of the diode and its emitter connected to the output terminal of the reference voltage generator, and at least two second transistors (T15, T16 or T18, T19 or T21, T22) whose emitters are connected to the other input terminals and whose collectors, connected together to the collector of the first transistor, constitute the output terminal of each of said second circuits.

6. A circuit for checking the parity of a 9-bit (B1–B9) byte, characterized in that it includes:
a first stage of logic circuits comprising four Exclusive OR circuits (30, 31, 33, 34) according to claim 3, each of whose inputs receives one of the bits,
a second stage of logic circuits comprising two Exclusive OR circuits (35, 36), the first of which receives as inputs the outputs of the first and second Exclusive OR circuits of the first stage, and the second of which receives as inputs the outputs of the third and fourth Exclusive OR circuits of the first stage,
a third stage of logic circuits comprising an Exclusive OR circuit (37) which receives as inputs the outputs A and B or the Exclusive OR circuits of the second stage and the remaining bit, and which provides an indication of the parity of the byte as its output.

7. A circuit according to claim 6, characterized in that the Exclusive OR circuits of the second stage include:
comparison means for comparing the input signals and for generating a 1 output if these two signals do not have the same value and a 0 output if they do.

8. A circuit according to claim 7, characterized in that the first stage includes a true/complement value generator which has an input receiving the remaining bit and two outputs supplying the true value, C, of said bit and the complement value, $\overline{C}$, thereof.

9. A circuit according to claim 8, characterized in that the Exclusive OR circuit in the last stage includes:
a first circuit (50) which has three inputs receiving the signals A, $\overline{C}$, B and an output (C50) at which the result of the function $$\overline{B(A \oplus \overline{C})},$$

is generated, a second circuit (51) which has three inputs receiving signals A, C, B and an output (C51) at which the result of the function $$\overline{B(A \oplus C)},$$

is generated, a NOR circuit (52) which has two inputs connected to the outputs of the first and second circuits and which provides the result of the function $A \oplus B \oplus C$ as its output.

10. An Exclusive-OR circuit for receiving a first binary input A, a second binary input B, and providing the Exclusive-OR functions, $A \oplus B$, thereof as an output, said Exclusive OR circuit comprising:
a first input terminal for receiving a first binary input A;
a second input terminal for receiving a second binary input B;
an output terminal for providing the logical binary output $A \oplus B$;
first, second, third, fourth, fifth, sixth, seventh, eighth and ninth transistors, said first, second, third and sixth through ninth transistors each having an emitter, base and collector, said fourth and fifth transistors each having an emitter, a common base and a common collector, said emitter of said fourth transistor and said emitter of said fifth transistor being respectively directly connected to said first and second input terminals;
a first diode having a cathode connected to said first input terminal and an anode connected to said base of said first transistor;
a second diode having a cathode connected to said second input terminal and an anode connected to said base of said second transistor;
a first resistor connected between said base of said first transistor and a first potential source, VP;
a second resistor connected between said base of said second transistor and said first potential source, VP;
first passive connection means connecting in common said collector of said first transistor, said collector of said second transistor and said base of said third transistor;
a third resistor connected between said first passive connection means and said first potential source, VP;
a fourth resistor connected between said common base of said fourth and fifth transistors and said first potential source, VP;
a second passive connection means connecting in common said base of said sixth transistor and said common collector of said fourth and fifth transistors;
a fifth resistor connected between said second passive connection means and said first potential source, VP;
third passive connection means connecting in common said collector of said third transistor, said collector of said sixth transistor, said collector of said seventh transistor, said base of said seventh transistor and said output terminal;
a sixth resistor connected between said third passive connection means and said first potential source, VP;

fourth passive connection means connecting in common said emitter of said first transistor, said emitter of said second transistor, said emitter of said eighth transistor and said collector of said ninth transistor, said fourth passive connection means impressing a reference potential, VR, on said emitters of said first and second transistors;

fifth passive connection means connecting in common said base of said eighth transistor and said collector of said eighth transistor;

a seventh resistor connected between said collector of said eighth transistor and said first potential source, VP;

an eighth resistor connected between said collector of eighth transistor and said base of said ninth transistor;

a ninth resistor connected between said base of said ninth transistor and said collector of said ninth transistor; and sixth passive connection means connecting in common said emitters of said third, sixth, seventh and ninth transistors and a second potential source, VS.

11. An Exclusive-OR circuit for receiving a first binary input A, a second binary input B and providing the Exclusive-OR function, A⊕B thereof as an output, said Exclusive OR circuit comprising:

first, second, third, fourth, fifth, sixth and seventh transistors, said first, second, third, sixth and seventh transistors each having an emitter, base and collector, said fourth and fifth transistors having a common base, a common collector and each having an emitter;

first and second diodes respectively having an anode and a cathode, said anode of said first diode being connected to said base of said first transistor and said anode of said second diode being connected to said base of said second transistor;

a first input terminal for receiving said first binary input A, said first input terminal being connected in common to said cathode of said first diode and said emitter of said fifth transistor;

a second input terminal for receiving said second binary input B, said second input terminal being connected in common to said cathode of said second diode and said emitter of said fourth transistor;

a first resistor connected between said base of said first transistor and a first potential source, VP;

a second resistor connected between said base of said second transistor and said first potential source, VP;

first passive connection means connecting in common said collector of said first transistor, said collector of said second transistor and said base of said third transistor;

a third resistor connected between said first passive connection means and said first potential source, VP;

second passive connection means connecting in common said common collector of said fourth and fifth transistors and said base of said sixth transistor;

a fourth resistor connected between said common base of said fourth and fifth transistors and said first potential source, VP;

a fifth resistor connected between said second passive connection means and said first potential source, VP;

a sixth resistor connected between said collector of said third transistor and said first potential source, VP;

third passive connection means connecting said emitters of said first and second transistors in common to a source of reference potential, VR, said reference potential being provided by a reference voltage generator;

fourth passive connection means connecting in common said emitter of said third transistor, said emitter of said sixth transistor, said emitter of said seventh transistor and a second potential source, VS;

fifth passive connection means connecting in common said collector of said third transistor, said collector of said sixth transistor, said collector of said seventh transistor, said base of said seventh transistor and an output terminal, said output terminal manifesting the logical binary output A⊕B in response to said first binary input A and said second binary input B.

12. An Exclusive-OR circuit, as recited in claim 11, wherein said reference voltage generator for providing the reference potential, VR, comprises:

eighth and ninth transistors, said eighth and ninth transistors each having an emitter, base and collector, said emitter of said ninth transistor being connected to said second potential source VS;

a seventh resistor connected between said collector of said eighth transistor and said first potential source, VP;

sixth passive connection means connecting in common said collector of said eighth transistor and said base of said eighth transistor;

an eighth resistor connected between said collector of said eighth transistor and said base of said ninth transistor;

a ninth resistor connected between said base of said ninth transistor and said collector of said ninth transistor;

said emitter of said eighth transistor and said collector of said ninth transistor being connected in common to a reference potential terminal for providing the reference potential VR, said reference potential terminal being connected in common to said emitters of said first and second transistors.

13. An Exclusive-OR circuit as recited in claim 10, 11 or 12, wherein the relative magnitude of the potential of said first potential VP, said second potential VS and said reference potential VR is as follows:

VS<VR<VP.

14. An Exclusive-OR circuit for receiving a first binary input A, a second binary input B, a third binary input C and providing the Exclusive-OR function A⊕B⊕C thereof as an output, said Exclusive OR circuit comprising:

first, second, third, fourth, fifth, sixth, seventh, eighth, ninth, tenth, eleventh, twelfth, thirteenth, fourteenth, fifteenth, sixteenth and seventeenth transistors, each of said transistors except said sixth, seventh, ninth, tenth, twelfth and thirteenth having an emitter, a base and a collector, said sixth and seventh transistors having a common base, a common collector and each having an emitter, said ninth and tenth transistors having a common base, a common collector and each having an emitter, said twelfth and thirteenth transistors having a common base, a common collector and each having an emitter;

first, second, third, fourth, fifth and sixth diodes, said first through sixth diodes each having an anode and a cathode, said anode of said first diode being connected to said base of said first transistor, said anode of said second diode being connected to said base of said second transistor, said anode of said third diode being connected to said base of said third transistor, said anode of said fourth diode being connected to said base of said fifth transistor, said anode of said fifth diode being connected to said base of said eighth transistor and said anode of said sixth diode being connected to said base of said eleventh transistor;

a first input terminal for receiving said first binary input A, said first input terminal being connected to said cathode of said first diode, said cathode of said fourth diode, said emitter of said ninth transistor and said emitter of said twelfth transistor;

a second input terminal for receiving said second binary input B, said second input terminal being connected to said cathode of said second diode, said emitter of said sixth transistor, said cathode of said fifth diode and said emitter of said thirteenth transistor;

a third input terminal for receiving said third binary input C, said third input terminal being connected to said cathode of said third diode, said emitter of said seventh transistor, said emitter of said tenth transistor and said cathode of said sixth diode;

a first resistor connected between said base of said first transistor and a first potential source, VP;

a second resistor connected between said base of said second transistor and said first potential source, VP;

a third resistor connected between said base of said third transistor and said first potential source, VP;

first passive connection means for connecting in common said collector of said first transistor, said collector of said second transistor, said collector of said third transistor and said base of said fourth transistor;

a fourth resistor connected between said first passive connection means and said first potential source, VP;

a fifth resistor connected between said collector of said fourth transistor and said first potential source, VP;

a sixth resistor connected between said base of said fifth transistor and said first potential source, VP;

a seventh resistor connected between said common base of said sixth and seventh transistors and said first source of potential, VP;

second passive connection means for connecting in common said collector of said fifth transistor, said common collector of said sixth and seventh transistors and said base of said fourteenth transistor;

an eighth resistor connected between said second passive connection means and said first source of potential, VP;

a ninth resistor connected between said base of said eighth transistor and said first potential source, VP;

a tenth resistor connected between said common base of said ninth and tenth transistors and said first potential source, VP;

third passive connection means for connecting in common said collector of said eighth transistor, said common collector of said ninth and tenth transistors and said base of said fifteenth transistor;

an eleventh resistor connected between said third passive connection means and said first source of potential, VP;

a twelfth resistor connected between said base of said eleventh transistor and said first potential source, VP;

a thirteenth resistor connected between said common base of said twelfth and thirteenth transistors and said first potential source, VP;

fourth passive connection means for connecting in common said collector of said eleventh transistor, said common collector of said twelfth and thirteenth transistors, and said base of said sixteenth transistor;

a fourteenth resistor connected between said fourth passive connection means and said first source of potential, VP;

fifth passive connection means for connecting in common said emitter of said first transistor, said emitter of said second transistor, said emitter of said third transistor, said emitter of said fifth transistor, said emitter of said eighth transistor, and said emitter of said eleventh transistor and a source of reference potential, VR, said source of reference potential being provided by a reference voltage generator;

sixth passive connection means for connecting in common said emitter of said fourth transistor, said emitter of said fourteenth transistor, said emitter of said fifteenth transistor, said emitter of said sixteenth transistor, said emitter of said seventeenth transistor and a second potential source, VS; and seventh passive connection means for connecting in common said collector of said fourth transistor, said collector of said fourteenth transistor, said collector of said fifteenth transistor, said collector of said sixteenth transistor, said collector of said seventeenth transistor, said base of said seventeenth transistor and an output terminal of said Exclusive-OR circuit, said output of said Exclusive-OR circuit manifesting the logical binary output A⊕B⊕C in response to said first binary input A, said second binary input B, and said third binary input C.

15. An Exclusive OR circuit, as recited in claim 14, wherein said reference voltage generator for providing the reference potential VR comprises:

eighteenth and nineteenth transistors, said eighteenth and nineteenth transistors each having an emitter, base and collector said emitter of said nineteenth transistor being connected to said second potential source, VS;

a fifteenth resistor connected between said collector of said eighteenth transistor and said first potential source, VP;

eighth passive connection means connecting in common said collector of said eighteenth transistor and said base of said eighteenth transistor;

a sixteenth resistor connected between said collector of said eighteenth transistor and said base of said nineteenth transistor;

a seventeenth resistor connected between said base of said nineteenth transistor and said collector of said nineteenth transistor;

said emitter of said eighteenth transistor and said collector of said nineteenth transistor being connected in common to a reference potential terminal for providing the reference potential VR, said reference potential terminal being connected in common to said emitters of said first, second, third, fifth, eighth and eleventh transistors.

16. An Exclusive OR circuit as recited in claim 14 or claim 15 wherein the relative magnitude of the potential of said first potential VP, said second potential VS and said reference potential VR is as follows:

VS<VR<VP.

17. A logical circuit which may be used as a parity generator circuit or a parity checking circuit for a data byte having eight binary bits of data, said logical circuit comprising:
first through eighth input terminals for respectively receiving said eight binary bits of data;
a ninth input terminal for receiving a parity related binary bit;
an output terminal for manifesting the binary output of said logical circuit;
a first two input Exclusive OR circuit having a first input connected to said first input terminal of said logical circuit, a second input connected to said second input terminal of said logical circuit and an output;
a second two input Exclusive OR circuit having a first input connected to said third input terminal of said logical circuit, a second input connected to said fourth input terminal of said logical circuit and an output;
a third two input Exclusive OR circuit having a first input connected to said fifth input terminal of said logical circuit, a second input connected to said sixth input terminal of said logical circuit and an output;
a fourth two input Exclusive OR circuit having a first input connected to said seventh input terminal of said logical circuit, a second input connected to said eighth input terminal of said logic circuit and an output;
a true/complement generator circuit having an input connected to said ninth input terminal of said logical circuit, a true output and a complement output;
a first comparison circuit having a first input connected to the output of said first two input Exclusive OR circuit, a second input connected to the output of said second two input Exclusive OR circuit and an output;
a second comparison circuit having a first input connected to the output of said third two input Exclusive OR circuit, a second input connected to the output of said fourth two input Exclusive OR circuit and an output;
a four input circuit for performing the Exclusive OR function of three binary inputs, said four inputs being respectively connected to said output of said first comparison circuit, said true output of said True/complement generator circuit, said complement output of said True/complement generator circuit and said output of said second comparison circuit, said four input circuit for performing the Exclusive OR function of three binary inputs also having an output connected to said output terminal of said logical circuit.

18. A four input circuit for performing the Exclusive OR function, A⊕B⊕C, of three binary inputs, namely A, B and C, said four input circuit comprising:

first, second, third, fourth, fifth, sixth, seventh and eighth transistors, said first through eighth transistors each having an emitter, base and collector;
first, second, third and fourth diodes, said first through fourth diodes each having a cathode and an anode, said anode of said first diode being connected to said base of said first transistor, said anode of said second diode being connected to said base of said second transistor, said anode of said third diode being connected to said base of said fifth transistor, and said anode of said fourth diode being connected to said base of said sixth transistor;
a first input terminal for receiving said A binary input, said first input terminal being connected in common to said emitter of said first transistor, said cathode of said second diode, said emitter of said fifth transistor and said cathode of said fourth diode;
a second input terminal for receiving said B binary input, said second input terminal being connected in common to said emitter of said third transistor and said base of said fourth transistor;
a third input terminal for receiving the true (C) value of said C binary input, said third input terminal being connected in common to said emitter of said sixth transistor and said cathode of said third diode;
a fourth input terminal for receiving said complement ($\overline{C}$) value of said C binary input, said fourth input terminal being connected to said emitter of said second transistor and said cathode of said first diode;
a first resistor connected between said base of said first transistor and a first potential source, VP;
a second resistor connected between said base of said second transistor and said first potential source, VP;
a third resistor connected between said base of said third transistor and said first potential source, VP;
a fourth resistor connected between said base of said fifth transistor and said first potential source, VP;
a fifth resistor connected between said base of said sixth transistor and said first potential source, VP;
first passive connection means connecting in common said collector of said first transistor, said collector of said second transistor, said collector of said third transistor and said base of said seventh transistor;
a sixth resistor connected between said first passive connection means and said first potential source, VP;
a seventh resistor connected between said collector of said seventh transistor and said first potential source, VP;
second passive connection means connecting in common said collector of said fourth transistor, said collector of said fifth transistor, said collector of said sixth transistor and said base of said eighth transistor;
an eighth resistor connected between said second passive connection means and said first potential source, VP;
third passive connection means connecting in common said emitter of said fourth transistor, said emitter of said seventh transistor, said emitter of said eighth transistor and a second potential source, VS; and
an output terminal for manifesting the Exclusive OR function A$\theta$B$\theta$C, of said three binary inputs A, B and C, said output terminal being connected in common to said collector of said seventh transistor and said collector of said eighth transistor.

19. A logical circuit, as claimed in claim 17, wherein said true/complement generator circuit includes:
first, second and third transistors, said first, second and third transistors each having an emitter, base and collector;
an input terminal for receiving a binary input, said input terminal being connected to said emitter of said first transistor;
a first resistor connected between said base of said first transistor and a first potential source, VP;
first passive circuit connection means for connecting in common said collector of said first transistor and said base of said second transistor;
a second resistor connected between said first passive circuit connection means and said first potential source, VP;
second passive circuit connection means for connecting in common said collector of said second transistor, said base of said third transistor and a first output terminal, said first output terminal providing the binary complement logical value of said binary input;
a third resistor connected between said second passive circuit connection means and said first potential source, VP;
a fourth resistor connected between said collector of said third transistor and said first potential source, VP;
a third passive connection means for connecting in common said emitter of said second transistor, said emitter of said third transistor and a second potential source, VS; and
a second output terminal connected to said collector of said third transistor, said second output terminal providing said binary true logical value of said binary input.

20. A logical circuit as recited in claim 17, wherein said first and second comparison circuits each include:
first, second, third and fourth transistors, said first, second and third transistors each having an emitter, base and collector;
first and second diodes, said first and second diodes each having an anode and a cathode, said anode of said first diode being connected to said base of said second transistor and said anode of said second diode being connected to said base of said first transistor;
a first input terminal for receiving a first binary input, said first input terminal being connected to said emitter of said first transistor and said cathode of said first diode;
a second input terminal for receiving a second binary input, said second input terminal being connected to said emitter of said second transistor and said cathode of said second diode;
a first resistor connected between said base of said first transistor and a first source of potential, VP;
a second resistor connected between said base of said second transistor and said first source of potential, VP;
first passive circuit connection means for connecting in common said collector of said first transistor, said collector of said second transistor and said base of said third transistor;
a third resistor connected between said first passive circuit connection means and said first source of potential, VP;
a fourth resistor connected between said collector of said third transistor and a said first source of potential, VP;
second passive circuit connection means connecting in common said emitter of said third transistor, said emitter of said fourth transistor and a second source of potential, VS; and
an output terminal connected to said collector of said third transistor, said output terminal providing a binary manifestation of the comparison of said first binary input and said second binary input.

21. A logical circuit as recited in claim 20, wherein one of said first and second comparison circuits further includes,
a fourth transistor having an emitter, base and collector, said collector and said base of said fourth transistor being connected in common to said collector of said third transistor, and said emitter of said fourth transistor being connected to said second source of potential, VS.

22. A logical circuit which may be used as a parity generator circuit or a parity checking circuit for a data byte having eight binary bits of data, said logical circuit comprising:
first through eighth input terminals for respectively receiving said eight binary bits of data;
a ninth input terminal for receiving a parity related binary bit;
an output terminal for manifesting the binary output of said logical circuit;
a first two input Exclusive OR circuit having a first input connected to said first input terminal of said logical circuit, a second input connected to said second input terminal of said logical circuit and an output;
a second two input Exclusive OR circuit having a first input connected to said third input terminal of said logical circuit, a second input connected to said fourth input terminal of said logical circuit and an output;
a third two input Exclusive OR circuit having a first input connected to said fifth input terminal of said logical circuit, a second input connected to said sixth input terminal of said logical circuit and an output;
a fourth two input Exclusive OR circuit having a first input connected to said seventh input terminal of said logical circuit, a second input terminal of said logic circuit connected to said eighth input terminal of said logical circuit and an output;
a fifth two input Exclusive OR circuit having a first input connected to said output of said first two input Exclusive OR circuit, a second input connected to said output of said second two input Exclusive OR circuit and an output;
a sixth two input Exclusive OR circuit having a first input connected to said output of said third two input Exclusive OR circuit, a second input connected to said output of said fourth two input Exclusive OR circuit and an output;
a three input Exclusive OR circuit, said three input Exclusive OR circuit having a first input connected to said output of said fifth two input Exclusive OR circuit, a second input connected to said output of said sixth two input Exclusive OR circuit, a third input connected to said ninth input terminal of said logical circuit and an output connected to output terminal of said logical circuit.

23. A logical circuit which may be used as a parity generator circuit or a parity checking circuit for a data byte having eight binary bits of data, said logical circuit comprising:
first through eighth input terminals for respectively receiving said eight binary bits of data;
a ninth input terminal for receiving a parity related binary bit;
an output terminal for manifesting the binary output of said logical circuit;
a first two input Exclusive OR circuit having a first input connected to said first input terminal of said logical circuit, a second input connected to said second input terminal of said logical circuit and an output;
a second two input Exclusive OR circuit having a first input connected to said third input terminal of said logical circuit, a second input connected to said fourth input terminal of said logical circuit and an output;
a third two input Exclusive OR circuit having a first input connected to said fifth input terminal of said logical circuit, second input connected to said sixth input terminal of said logical circuit and an output;
a fourth two input Exclusive OR circuit having a first input connected to said seventh input terminal of said logical circuit, a second input terminal connected to said eighth input terminal of said logic circuit and an output;
a True/Complement generator circuit having an input connected to said ninth input terminal of said logical circuit, a true output and a complement output;
a fifth two input Exclusive OR circuit having a first input connected to the output of said first two input Exclusive OR circuit, a second input connected to the output of said second two input Exclusive OR circuit and an output;
a sixth two input Exclusive OR circuit having a first input connected to the output of said third two input Exclusive OR circuit, a second input connected to the output of said fourth two input Exclusive OR circuit and an output;
a four input circuit for performing the Exclusive OR function of three binary inputs, said four inputs being respectively connected to said output of said fifth two input Exclusive OR circuit, said true output of said True/complement generator circuit, said complement output of said True/Complement generator circuit and said output of said sixth two input Exclusive OR circuit, said four input circuit for performing the Exclusive OR function of three binary inputs also having an output connected to said output terminal of said logical circuit.

24. A logical circuit, as claimed in claim 17 or 23 wherein said four input circuit for performing the Exclusive OR function of three binary inputs, namely A, B and C comprises:
first, second, third, fourth, fifth, sixth, seventh and eighth transistors, said first through eighth transistors each having an emitter, base and collector;
first, second, third and fourth diodes, said first through fourth diodes each having a cathode and an anode, said anode of said first diode being connected to said base of said first transistor, said anode of said second diode being connected to said base of said second transistor, said anode of said third diode being connected to said base of said fifth transistor, and said anode of said fourth diode, being connected to said base of said sixth transistor;
a first input terminal for receiving said A binary input, said first input terminal being connected in common to said emitter of said first transistor, said cathode of said second diode, said emitter of said fifth transistor and said cathode of said fourth diode;
a second input terminal for receiving said B binary input, said second input terminal being connected in common to said emitter of said third transistor and said base of said fourth transistor;
a third input terminal for receiving the true (C) value of said C binary input, said third input terminal being connected in common to said emitter of said sixth transistor and said cathode of said third diode;
a fourth input terminal for receiving said complement $(\overline{C})$ value of said C binary input, said fourth input terminal being connected to said emitter of said second transistor and said cathode of said first diode;
a first resistor connected between said base of said first transistor and a first potential source, VP;
a second resistor connected between said base of said second transistor and said first potential source, VP;
a third resistor connected between said base of said third transistor and said first potential source, VP;
a fourth resistor connected between said base of said fifth transistor and said first potential source, VP;
a fifth resistor connected between said base of said sixth transistor and said first potential source, VP;
first passive circuit connection means connecting in common said collector of said first transistor, said collector of said second transistor, said collector of said third transistor and said base of said seventh transistor;
a sixth resistor connected between said first passive circuit connection means and said first potential source, VP; p1 a seventh resistor connected between said collector of said seventh transistor and said first potential source, VP;
second passive circuit connection means connecting in common said collector of said fourth transistor, said collector of said fifth transistor, said collector of said sixth transistor and said base of said eighth transistor;
an eighth resistor connected between said second passive circuit connection means and said first potential source, VP;
a third passive circuit connection means connecting in common said emitter of said fourth transistor, said emitter of said seventh transistor, said emitter of said eighth transistor and a second potential source, VS; and
an output terminal for manifesting the Exclusive OR function, $A \oplus B \oplus C$, of said three binary inputs A, B and C, said output terminal being connected in common to said collector of said seventh transistor and said collector of said eighth transistor.

25. A logical circuit, as recited in claim 17, wherein each of said first, second, third and fourth two input Exclusive OR circuits comprises:
a first input terminal for receiving a first binary input A;

a second input terminal for receiving a second binary input B;

an output terminal for providing the logical binary output A⊕B;

first, second, third, fourth, fifth, sixth, seventh, eighth and ninth transistors, said first, second, third and sixth through ninth transistors each having an emitter, base and collector, said fourth and fifth transistor each having an emitter, a common base and a common collector, said emitter of said fourth transistor and said emitter of said fifth transistor being respectively directly connected to said first and second input terminals;

a first diode having a cathode connected to said first input terminal and an anode connected to said base of said first transistor;

a second diode having a cathode connected to said second input terminal and an anode connected to said base of said second transistor;

a first resistor connected between said base of said first transistor and a first potential source, VP;

a second resistor connected between said base of said second transistor and said first potential source, VP;

first passive circuit connection means connecting in common said collector of said first transistor, said collector of said second transistor and said base of said third transistor;

a third resistor connected between said first passive circuit connection means and said first potential source, VP;

a fourth resistor connected between said common base of said fourth and fifth transistors and said first potential source, VP;

a second passive circuit connection means connecting in common said base of said sixth transistor and said common collector of said fourth and fifth transistors;

a fifth resistor connected between said second passive circuit connection means and said first potential source, VP;

third passive circuit connection means connecting in common said collector of said third transistor, said collector of said sixth transistor, said collector of said seventh transistor, said base of said seventh transistor and said output terminal;

a sixth resistor connected between said third passive circuit connection means and said first potential source, VP;

fourth passive circuit connection means connecting in common said emitter of said first transistor, said emitter of said second transistor, said emitter of said eighth transistor and said collector of said ninth transistor, said fourth passive circuit connection means impressing a reference potential, VR, on said emitters of said first and second transistors;

fifth passive circuit connection means connecting in common said base of said eighth transistor and said collector of said eighth transistor;

a seventh resistor connected between said collector of said eighth transistor and said first potential source, VP;

an eighth resistor connected between said collector of eighth transistor and said base of said ninth transistor;

a ninth resistor connected between said base of said ninth transistor and said collector of said ninth transistor; and sixth passive circuit connection means connecting in common said emitters of said third, sixth, seventh and ninth transistors and a second potential source, VS.

26. A logical circuit, as recited in claim 25, wherein the relative magnitude of the potential of said first potential source VP, said second potential source, VS, and said reference potential, VR, is as follows:

$$VS<VR<VP.$$

27. A logical circuit, as claimed in claim 22 or 23 wherein each of said first, second, third, fourth, fifth and sixth two input Exclusive OR circuits each comprise:

a first input terminal for receiving a first binary input A;

a second input terminal for receiving a second binary input B;

an output terminal for providing the logical binary output A⊕B;

first, second, third, fourth, fifth, sixth, seventh, eighth and ninth transistors, said first, second, third and sixth through ninth transistors each having an emitter, base and collector, said fourth and fifth transistor each having an emitter, a common base and a common collector, said emitter of said fourth transistor and said emitter of said fifth transistor being respectively directly connected to said first and second input terminals;

a first diode having a cathode connected to said first input terminal and an anode connected to said base of said first transistor;

a second diode having a cathode connected to said second input terminal and an anode connected to said base of said second transistor;

a first resistor connected between said base of said first transistor and a first potential source, VP;

a second resistor connected between said base of said second transistor and said first potential source, VP;

first passive circuit connection means connecting in common said collector of said first transistor, said collector of said second transistor and said base of said third transistor;

a third resistor connected between said first passive circuit connection means and said first potential source, VP;

a fourth resistor connected between said common base of said fourth and fifth transistors and said first potential source, VP;

a second passive circuit connection means connecting in common said base of said sixth transistor and said common collector of said fourth and fifth transistors;

a fifth resistor connected between said second passive circuit connection means and said first potential source, VP;

third passive circuit connection means connecting in common said collector of said third transistor, said collector of said sixth transistor, said collector of said seventh transistor, said base of said seventh transistor and said output terminal;

a sixth resistor connected between said third passive circuit connection means and said first potential source, VP;

fourth passive circuit connection means connecting in common said emitter of said first transistor, said emitter of said second transistor, said emitter of said eighth transistor and said collector of said ninth transistor, said fourth passive circuit connection means impressing a reference potential, VR, on said emitters of said first and second transistors;

fifth passive circuit connection means connecting in common said base of said eighth transistor and said collector of said eighth transistor;

a seventh resistor connected between said collector of said eighth transistor and said first potential source, VP;

an eighth resistor connected between said collector of eighth transistor and said base of said ninth transistor;

a ninth resistor connected between said base of said ninth transistor and said collector of said ninth transistor; and sixth passive circuit connection means connecting in common said emitters of said third, sixth, seventh and ninth transistors and a second potential source, VS.

28. A logical circuit, as claimed in claim 22 wherein said three input Exclusive OR circuit comprises:

first, second, third, fourth, fifth, sixth, seventh, eighth, nineth, tenth, eleventh, twelfth, thirteenth, fourteenth, fifteenth, sixteenth and seventeenth transistors, each of said transistors except said sixth, seventh, ninth, tenth, twelfth and thirteenth having an emitter, a base and a collector, said sixth and seventh transistors having a common base, a common collector and each having an emitter, said ninth and tenth transistors having a common base, a common collector and each having an emitter, said twelfth and thirteenth transistors having a common base, a common collector and each having an emitter;

first, second, third, fourth, fifth and sixth diodes, said first through sixth diodes each having an anode and a cathode, said anode of said first diode being connected to said base of said first transistor, said anode of said second diode being connected to said base of said second transistor, said anode of said third diode being connected to said base of said third transistor, said anode of said fourth diode being connected to said base of said fifth transistor, said anode of said fifth diode being connected to said base of said eighth transistor and said anode of said sixth diode being connected to said base of said eleventh transistor;

a first input terminal for receiving a first binary input A, said first input terminal being connected to said cathode of said first diode, said cathode of said fourth diode, said emitter of said ninth transistor and said emitter of said twelfth transistor;

a second input terminal for receiving a second binary input B, said second input terminal being connected to said cathode of said second diode, said emitter of said sixth transistor, said cathode of said fifth diode and said emitter of said thirteenth transistor;

a third input terminal for receiving a third binary input C, said third input terminal being connected to said cathode of said third diode, said emitter of said seventh transistor, said emitter of said tenth transistor and said cathode of said sixth diode;

a first resistor connected between said base of said first transistor and a first potential source, VP;

a second resistor connected between said base of said second transistor and said first potential source, VP;

a third resistor connected between said base of said third transistor and said first potential source, VP;

first passive connection means for connecting in common said collector of said first transistor, said collector of said second transistor, said collector of said third transistor and said base of said fourth transistor;

a fourth resistor connected between said first passive connection means and said first potential source, VP;

a fifth resistor connected between said collector of said fourth transistor and said first potential source, VP;

a sixth resistor connected between said base of said fifth transistor and said first potential source, VP;

a seventh resistor connected between said common base of said sixth and seventh transistors and said first source of potential, VP;

second passive connection means for connecting in common said collector of said fifth transistor, said common collector of said sixth and seventh transistors and said base of said fourteenth transistor;

an eighth resistor connected between said second passive connection means and said first source of potential, VP;

a ninth resistor connected between said base of said eigth transistor and said first potential source, VP;

a tenth resistor connected between said common base of said ninth and tenth transistors and said first potential source, VP;

third passive connection means for connecting in common said collector of said eighth transistor, said common collector of said ninth and tenth transistors and said base of said fifteenth transistor;

an eleventh resistor connected between said third passive connection means and said first source of potential, VP;

a twelfth resistor connected between said base of said eleventh transistor and said first potential source, VP;

a thirteenth resistor connected between said common base of said twelfth and thirteenth transistors and said first potential source, VP;

fourth passive connection means for connecting in common said collector of said eleventh transistor, said common collector of said twelfth and thirteenth transistors, and said base of said sixteenth transistor;

a fourteenth resistor connected between said fourth passive connection means and said first source of potential, VP;

fifth passive connection means for connecting in common said emitter of said first transistor, said emitter of said second transistor, said emitter of said third transistor, said emitter of said fifth transistor, said emitter of said eighth transistor, and said emitter of said eleventh transistor and a source of reference potential, VR, said source of reference potential being provided by a reference voltage generator;

sixth passive connection means for connecting in common said emitter of said fourth transistor, said emitter of said fourteenth transistor, said emitter of said fifteenth transistor, said emitter of said sixteenth transistor, said emitter of said seventeenth transistor and a second potential source, VS; and seventh passive connection means for connecting in common said collector of said fourth transistor, said collector of said fourteenth transistor, said collector of said fifteenth transistor, said collector of said sixteenth transistor, said collector of said seventeenth transistor and said base of said seventeenth transistor and an output terminal of said Exclusive OR circuit, said output terminal of said Exclusive OR circuit manifesting the logical binary output A⊕B⊕C in response to said first binary input A, said second binary input B and said third binary input C.

* * * * *